United States Patent
Ha (10) Patent No.: US 6,197,608 B1
(45) Date of Patent: Mar. 6, 2001

(54) MASK FOR AREA FORMING SELECTIVE GRATING AND SELECTIVE AREA GROWTH AND METHOD FOR FABRICATING SEMICONDUCTOR DEVICE BY UTILIZING THE SAME

(75) Inventor: Hong-tchoon Ha, Yongin (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/324,852

(22) Filed: Jun. 3, 1999

(30) Foreign Application Priority Data

Jul. 22, 1998 (KR) ................................... 98-29512
Dec. 22, 1998 (KR) ................................... 98-57149

(51) Int. Cl.⁷ ........................... H01L 21/302; H01L 21/20
(52) U.S. Cl. .................................................. 438/22
(58) Field of Search .................... 438/22, 27, 29, 438/32, 42, 41, 39, 483, 942; 359/248; 257/80; 372/50

(56) References Cited

U.S. PATENT DOCUMENTS

| | | | |
|---|---|---|---|
| 4,782,035 | * 11/1988 | Fujiwara | 438/32 |
| 5,147,825 | * 9/1992 | Koch et al. | 438/32 |
| 5,225,039 | * 7/1993 | Ohguri | 438/32 |
| 5,450,437 | * 9/1995 | Shm et al. | 438/32 |
| 5,530,580 | * 6/1996 | Thompson et al. | 359/248 |
| 5,543,353 | * 8/1996 | Suzuki et al. | 438/32 |
| 5,601,731 | * 2/1997 | Hillmer | 438/32 |
| 5,614,436 | * 3/1997 | Shim et al. | 438/32 |
| 5,684,823 | * 11/1997 | Goto et al. | 438/32 |
| 5,701,325 | * 12/1997 | Ouchi et al. | 438/32 |
| 5,784,188 | * 7/1998 | Nakamura et al. | 359/248 |
| 5,789,274 | * 8/1998 | Yamaguchi et al. | 438/32 |
| 5,811,838 | * 9/1998 | Inomoto | 257/80 |
| 5,880,028 | * 3/1999 | Yamamoto et al. | 438/32 |
| 5,981,307 | * 11/1999 | Matsuda | 438/32 |
| 6,043,104 | * 3/2000 | Uchida | 438/32 |

* cited by examiner

Primary Examiner—Savitri Mulpuri
(74) Attorney, Agent, or Firm—Burns, Doane, Swecker & Mathis, L.L.P.

(57) ABSTRACT

A mask for forming a selective grating and selective area growth and a method for fabricating an electro-absorption modulated laser device by utilizing the mask are disclosed. The mask for forming the selective grating and the selective area growth comprises a + shaped island type pattern and a stripe type pattern to allow, during the formation of the selective grating, the selective grating to be formed only in a laser diode region, and to allow, during the selective area epitaxial growth, the selective area growth to be carried out only with the stripe pattern in the diode laser region after the island pattern being removed.

7 Claims, 11 Drawing Sheets

MASK FOR AREA FORMING SELECTIVE GRATING AND SELECTIVE AREA GROWTH AND METHOD FOR FABRICATING SEMICONDUCTOR DEVICE BY UTILIZING THE SAME

BACKGROUND OF THE INVENTION

1. Field of the Invention

The present invention relates to a mask for forming a selective grating and selective area growth and a method for fabricating an electro-absorption modulated laser device by utilizing the mask.

2. Description of the Related Art

In general, an electro-absorption modulated laser (referred to as EML hereinafter) device used for optical communications utilizes Franz-Keldysh effect, and has a structure in which a laser diode and a modulator are integrated on the same substrate. In addition, the EML device structurally has a diffraction grating formed in a laser diode region to maintain a single mode even during a high speed modulation.

Figure 1:
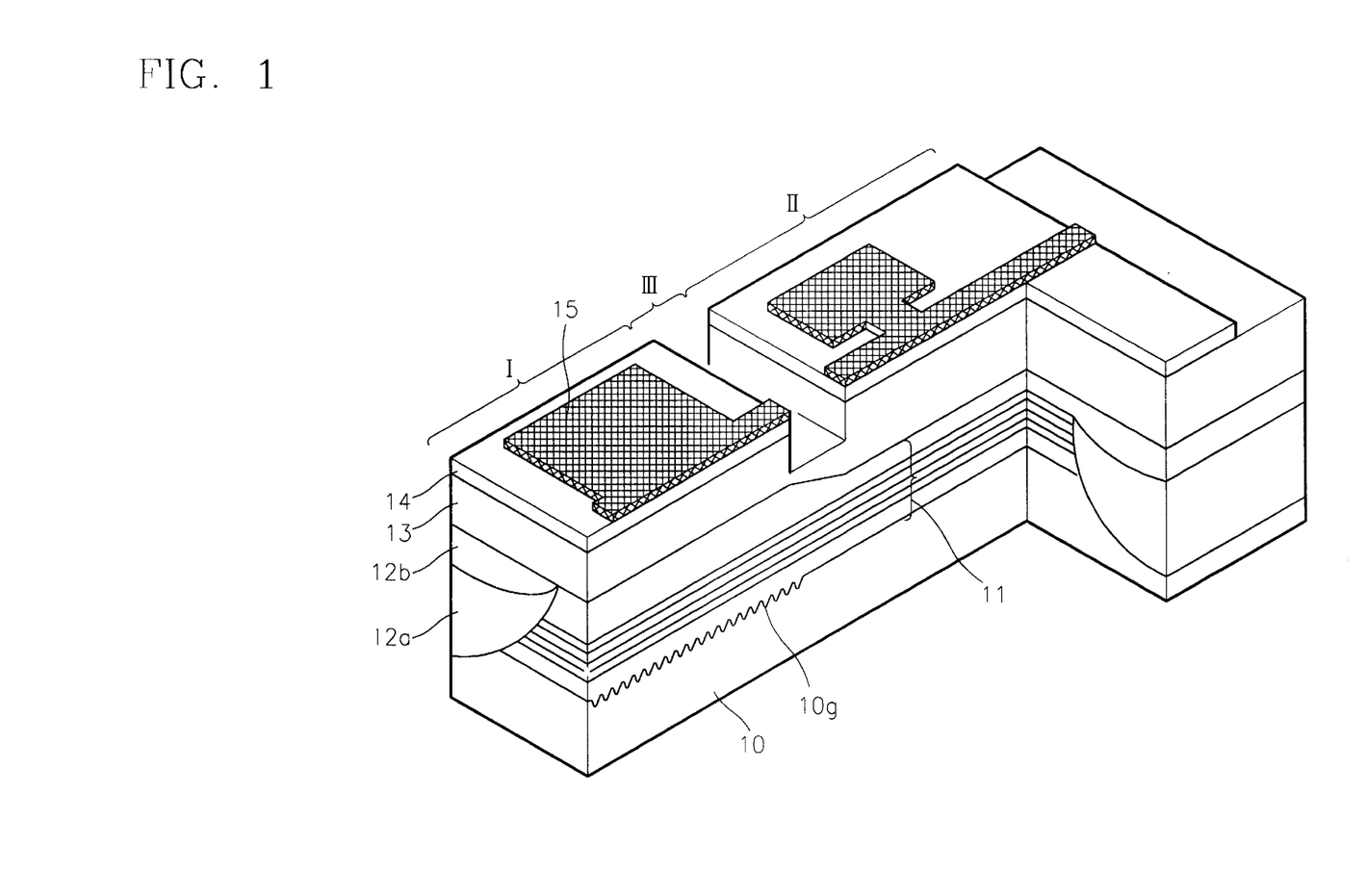
FIG. 1 is a partially cut away perspective view illustrating one example of an EML device.

FIG. 1 is a partially cut away perspective view illustrating an example of an EML device. As shown in FIG. 1, an EML has a distributed feedback laser diode I and an electro-absorption modulator II which are integrated on the same substrate 10 with an electrically separating region disposed therebetween. A diffraction grating 10g is formed in the laser diode region I of the substrate 10, and not in the modulator region II. On the substrate 10 in which the selective diffraction grating 10g is thus formed, basic epitaxial layers 11 including an active layer are formed in an embedded configuration, current blocking layers 12a and 12b are formed at sides of the basic epitaxial layers 11. In addition, a clad layer 13 and a cap layer 14 are formed on the basic epitaxial layers 11 and the current blocking layers 12a and 12b, electrodes 15 are formed on the cap layer 14. In such EML device, the high speed modulation can be performed by causing light emitted from the distributed feedback laser diode I to be absorbed in the modulator II or pass through the modulator II according to whether a voltage is applied to the modulator or not while the distributed feedback laser diode I is continuously operated.

A method for fabricating such EML device will be described as follows. First, the selective grating 10g is formed on the region I of the substrate 10 on which the distributed feedback laser is formed. To this end, after a silicon dioxide ($SiO_2$) film is deposited on the substrate 10, a predetermined pattern is formed by using conventional lithographic process employing a mask in which a pattern for the selective grating is formed. Then, the mask of the silicon dioxide film for forming the selective grating is removed.

Next, after a silicon dioxide is deposited again, a selective area growth mask is formed by a conventional photolithographic method. The epitaxial layers 11 which comprises an active layer of a multiple quantum well structure and lower and upper clad layers formed at the lower and upper sides of the active layer for lasing are grown by using the selective area growth mask. Then, after mesa etching is performed to form a strong index guiding structure, the current blocking layers 12a and 12b for current confinement are formed at the etched portion. Next, after the upper clad layer 13 is regrown, and the cap layer 14 is formed thereon, the electrodes 15 are formed to complete the fabrication of the EML device.

Figure 2:
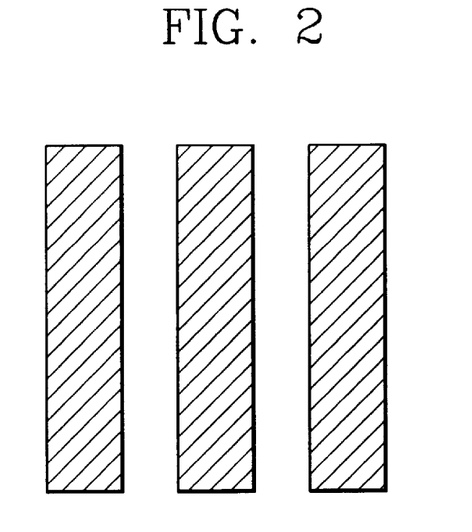
FIG. 2 is a plan view illustrating a pattern of a conventional stripe type mask for forming a selective grating.
Figure 3:
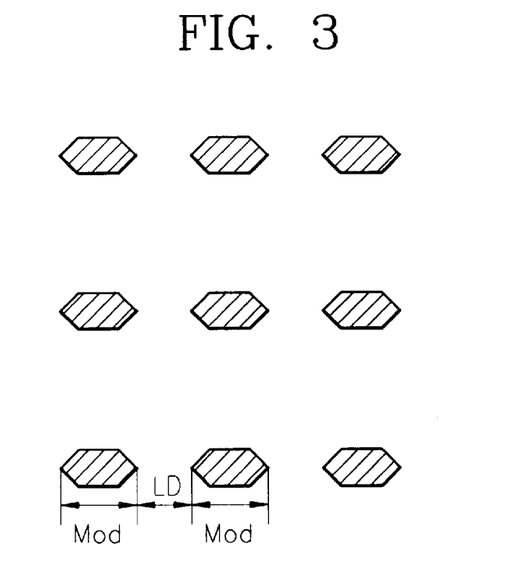
FIG. 3 is a plan view illustrating a pattern of a conventional island type mask for forming a selective grating.

In the EML device fabricated as above, the grating plays an important role in causing the EML device to operate in a single mode during the high speed operation. That is, it is important that the pitch of the grating is precisely formed for an emitted laser beam to form a single mode beam. FIGS. 2 and 3 show patterns of conventional selective grating masks for forming a grating of the above EML device. FIG. 2 shows a pattern of a stripe type mask, and FIG. 3 shows a pattern of an island type mask.

First, a method for fabricating a grating with a stripe type mask will be described as follows.

After a $SiO_2$ thin film is deposited on a InP substrate 10, a stripe type mask 100 is formed by patterning the film as shown in FIG. 4.

Figure 4A:
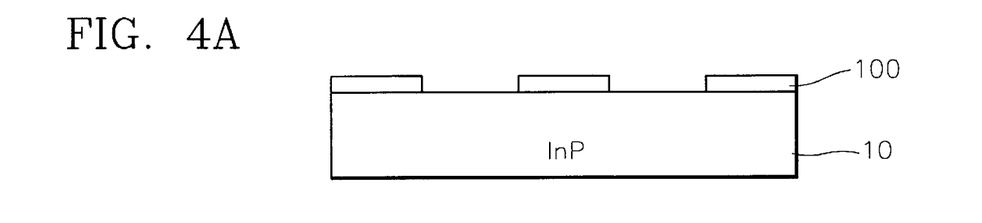
FIGS. 4A through 4E are section views illustrating, in sequence, the steps of a method for forming a diffraction grating by using the stripe type mask of FIG. 2 for forming a selective grating.
Figure 4B:
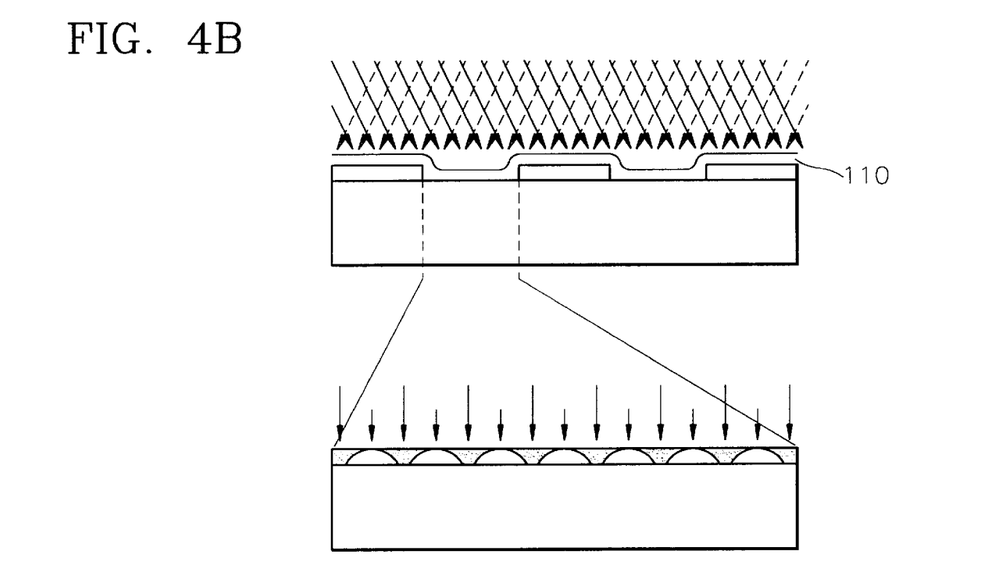

Next, as shown in FIG. 4B, photoresist is deposited on the substrate 10 provided with the mask 100, and exposure utilizing a holographic effect is performed. By doing this, incident light rays on the photoresist surface form a grating pattern in which low and high illumination regions are repeatedly formed at constant distances by interference between the incident light rays from two directions. Accordingly, the exposed photoresist film has different exposure depths in a grating pattern as shown in FIG. 4B.

Figure 4C:
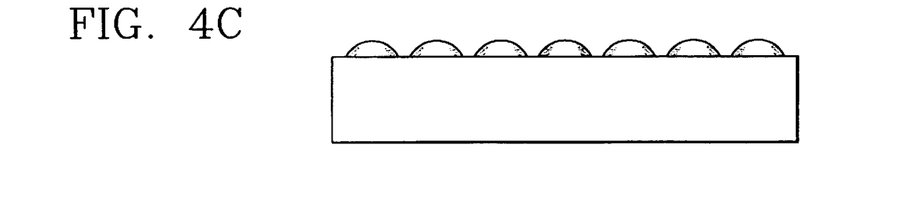

Next, when the exposed photoresist film has been developed, deeply exposed portions are removed, and as shown in FIG. 4C, the substrate appears in a grating pattern.

Figure 4D:
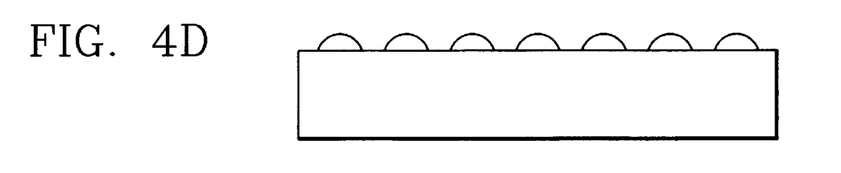

Since the pattern of the photoresist film developed as above has rough figures and is hardly used as it is, the edge portions of the pattern are slight burned out with an $O_2$ asher, and the figures of the pattern are made to be precise as shown in FIG. 4D.

Figure 4E:
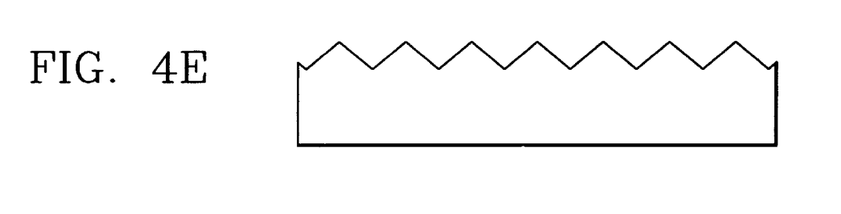

Next, when the substrate 10 is etched by wet or dry etching, a grating is formed, and the photoresist is removed as shown in FIG. 4E.

Figure 5:
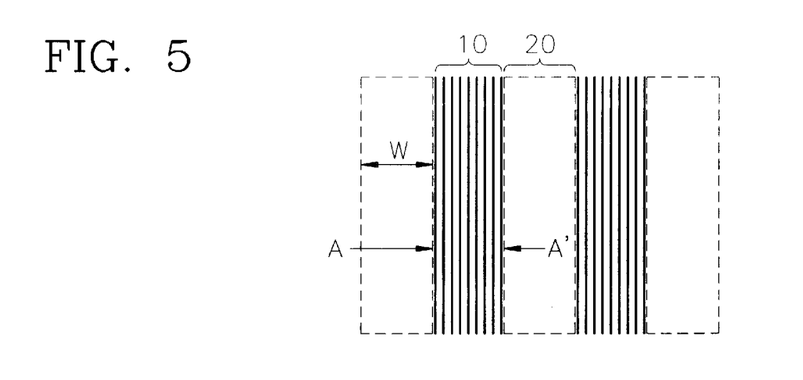
FIG. 5 is a plan view illustrating the shape of the diffraction grating formed by the method shown in FIGS. 4A through 4E.
Figure 6:
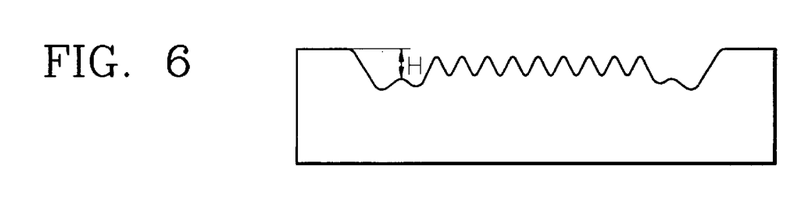
FIG. 6 is a section view illustrating the shape of the diffraction grating formed by the method shown in FIGS. 4A through 4E.
Figure 7:
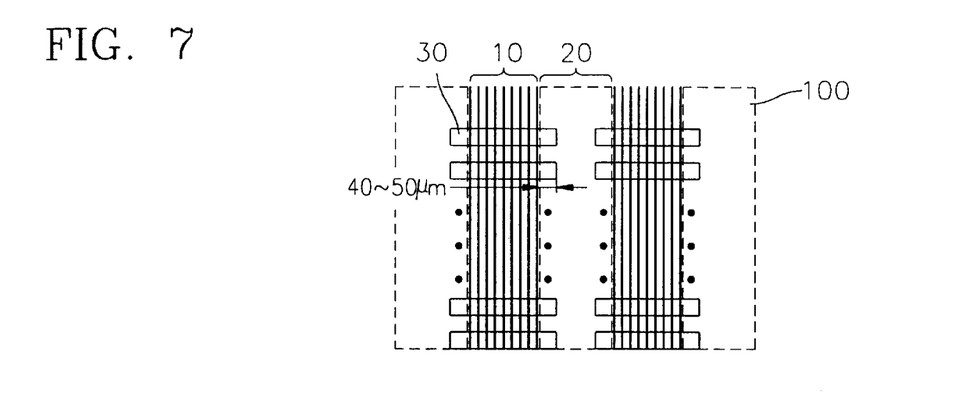
FIG. 7 is a plan view illustrating a disposition area of a selective area growth mask disposed on the diffraction grating formed by the method shown in FIGS. 4A through 4E.
Figure 8:
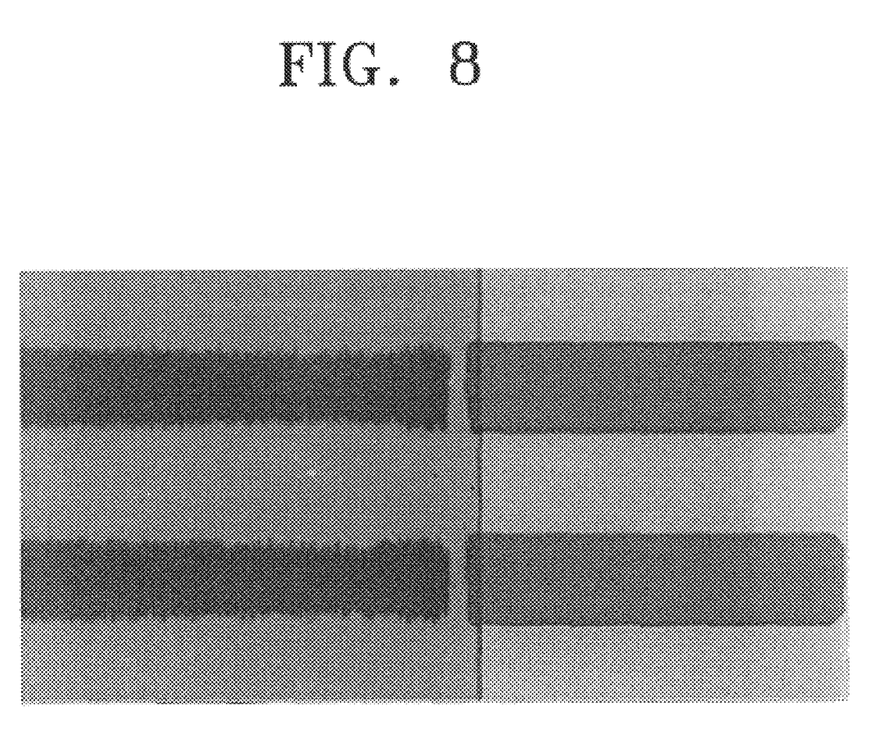
FIG. 8 is a photograph illustrating a plan view of an actual diffraction grating formed by the method shown in FIGS. 4A through 4E and selective area growth pattern.

However, if the grating is formed by using such a stripe type mask, a stepped portion is formed between the region in which the grating is formed and the region in which the grating is not formed. FIG. 5 shows the whole appearance of the grating formed by the above process, and FIG. 6 shows a section view taken along line A–A' of FIG. 5. As shown in FIG. 6, a height difference H occurs between the region 10 in which the grating is formed and the region 20 in which the grating is not formed. This occurs because etchant on the silicon dioxide film used as a mask during etching is concentrated in the vicinity of the boundary of two regions while the etchant diffuses toward the region 10 in which the grating is formed. Therefore, etching rate at the boundary is highly increased, and accordingly, etching occurs deeply to form the height difference H. In particular, when the width of a patterned silicon dioxide film is wider, such height difference H becomes larger since more etchant diffuses toward the boundary. In case that such height difference H occurs, when a selective area growth mask pattern 30 is subsequently formed on selected areas of the grating region 10 to grow a laser oscillating layer as shown in FIG. 7, there is a problem in which the selective area growth mask pattern 30 may have discontinuities at the boundary as shown in FIG. 8.

Figure 9:
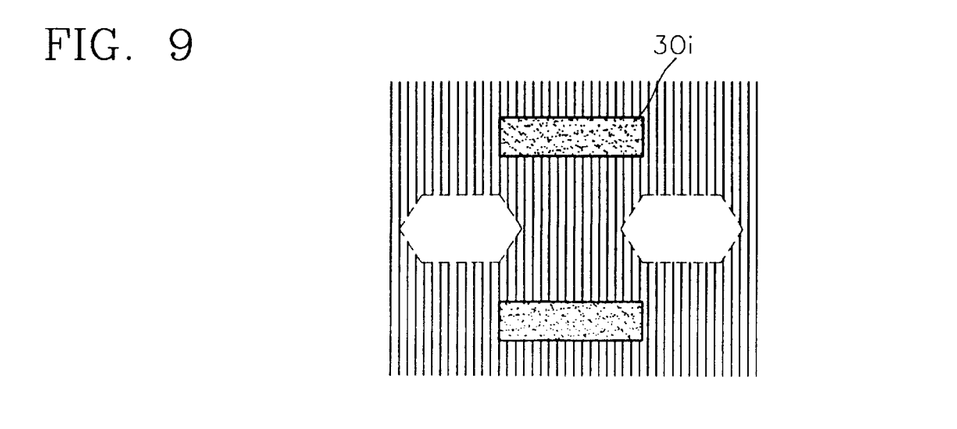
FIG. 9 is a plan view illustrating a disposition area of a selective area growth mask disposed on the diffraction grating formed by the island type mask shown in FIG. 3.

In order to improve such height differences, a method for forming a grating by using the island type mask pattern was proposed. In case that the stripe type mask is used, the width of the stripe is reduced to reduce the quantity of the etchant diffusing toward the boundary. However, when the stripe type pattern is used as a mask, the width of the stripe cannot be reduced since the width of the stripe is the length of the modulator. When an island type mask in which an island pattern is formed to have a length corresponding to the length of the modulator and a gap corresponding to the length of the laser diode is used, the problem of the height differences can be solved. However, even in case that such island type mask is used, there is still a problem. There is almost no problem in forming a grating in a selected area, but in case that a selective area growth mask pattern 30i for epitaxial growth for laser oscillation is formed in the selected area on the grating as shown in FIG. 9, the surface of the mask pattern is not clearly defined.

Figure 10A:
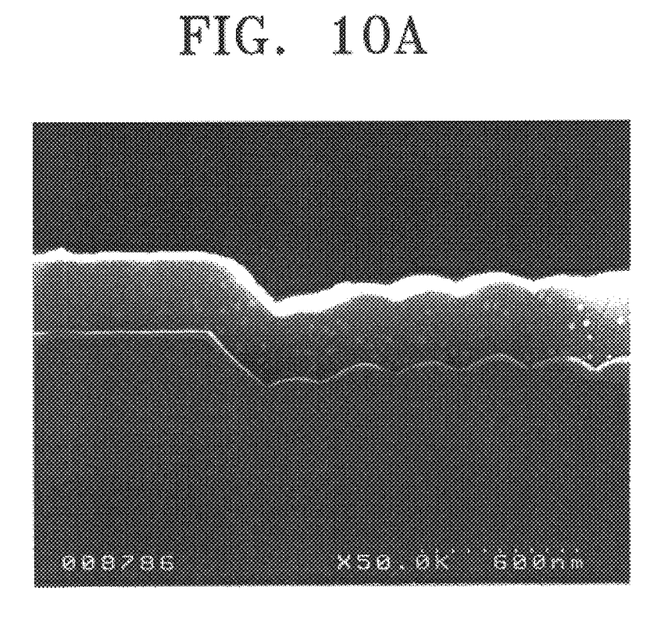
FIGS. 10A and 10B are SEM (Scanning Electron Microscope) photographs illustrating problems occurring when selective area growth masks are formed on the diffraction gratings formed respectively by using the stripe type mask of FIG. 2 and the island type mask of FIG. 3 for forming the selective grating.
Figure 10B:
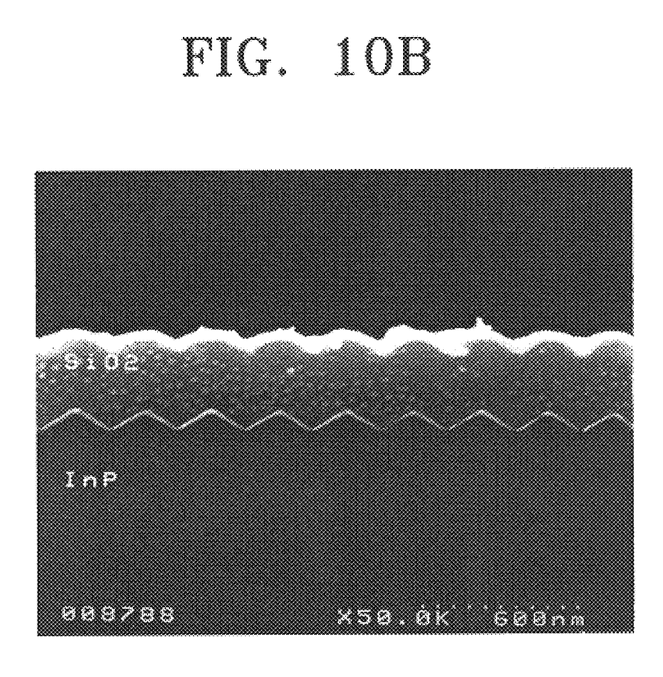

FIGS. 10A and 10B are photographs by a scanning electron microscope (SEM) illustrating problems occurring in fabricating an EML device by a grating forming method using a conventional stripe or island type mask. That is, FIGS. 10A and 10B shows problems arising when a selective area growth mask for selectively growing an epitaxial layer for laser oscillation, in which a grating is formed by using a stripe or island type mask is made of $SiO_2$. FIG. 10A shows a case in which a grating is formed by using a stripe type mask, and it can be found that the height differences seriously occur at the boundary between the region in which the grating is formed and the region in which the grating is not formed, and a $SiO_2$ mask pattern for selective area growth is bent at the boundary and the $SiO_2$ mask pattern on the grating is not precisely formed. On the other hand, FIG. 10B shows a case in which a grating is formed by using an island type mask, and it can be found that though the problem concerning the height difference at the boundary is improved, a $SiO_2$ mask pattern for selective area growth is still not smartly formed on the grating.

SUMMARY OF THE INVENTION

To solve the above problems, it is an objective of the present invention to provide a mask for a selective grating and selective area growth, which, in fabricating an EML (electro-absorption modulated laser) device, prevents height differences between a region in which the grating is formed and a region in which the grating is not formed from occurring, and enables a selective area growth mask pattern for selectively growing an epitaxial layer for laser oscillation to be formed precisely, and a method for fabricating the EML device by utilizing the mask.

Accordingly, to achieve the above objective, there is provided a mask for forming a selective grating and selective area growth which has mask patterns formed on the same substrate by the same process and required, of the steps of fabricating an electro-absorption modulated laser device in which a laser diode and an optical modulator are formed by continuous epitaxial growth, in a first step in which a selective diffraction grating is formed selectively in laser diode region and a second step in which the selective area growth is carried out for epitaxial growth in the laser diode region to proceed faster than epitaxial growth in the modulator region including a pattern for forming the selective diffraction grating, the pattern being formed to correspond to the modulator region, being used in forming the selective diffraction grating during the first step, and being removed during the second step, and a pattern for the selective area growth, the pattern preventing the selective diffraction grating from forming around the laser diode region of a stripe shape during the first step, and allowing the selective area growth to proceed in the diode laser region of a stripe shape during the second step, wherein trench regions are formed between the stripe type pattern and the inserted portion of the island type pattern to have a predetermined depth.

In the present invention, the pattern for forming the selective diffraction grating is formed to be an island type pattern in which the region other than the portion of the pattern inserted between the selective area growth pattern is larger than the modulator region. Also, the selective area growth pattern is formed in a stripe shape.

To achieve the above objective, there is provided a method for fabricating an electro-absorption modulated laser device in which a laser diode and an optical modulator are formed on a substrate by continuous epitaxial growth comprising (a) forming a mask for forming a selective diffraction grating and selective area growth, the mask comprising, on the substrate, a pattern for forming the selective diffraction grating which is formed to correspond to the modulator region and a pattern for the selective area growth which allows the selective area growth to be carried out in the laser diode region of a stripe shape wherein trench regions are formed between the stripe type pattern and the inserted portion of the island type pattern to have a predetermined depth, (b) forming the selective diffraction grating on the substrate of the laser diode region by using the mask for forming the selective diffraction grating and the selective area growth, (c) removing the pattern for forming the selective diffraction grating from the mask for forming the selective diffraction grating and the selective area growth, and forming a mask for the selective area growth which is composed of the selective area growth pattern only, (d) growing epitaxial layers for laser oscillation and optical modulation on the substrate of the laser diode region and the modulator region wherein the selective area growth is performed by growing the epitaxial layers on the diffraction grating in the laser diode region fast than epitaxial growth in the modulator region, (e) etching both edge of the epitaxial layers to form a mesa structure, and forming current blocking layers on the etched portions, (f) forming a cap layer on the mesa structure and the current blocking layers, and (g) depositing electrode metal on the epitaxial layers, and forming a trench region by performing etching for electrically isolating the laser diode and the modulator from each other.

In the present invention, the pattern for forming the selective diffraction grating is preferably formed to be an island type pattern in which the region other than the portion of the pattern inserted between the selective area growth pattern is larger than the modulator region, and the selective area growth pattern is preferably formed in a stripe shape. Also, the mask pattern is preferably made of a silicon dioxide film.

In addition, in the present invention, the step (b) includes the sub-steps of (b1) coating photoresist on the substrate on which the mask for forming the selective diffraction grating and the selective area growth, (b2) exposing the photoresist film to light rays of a grating pattern by a holographic effect to form a grating pattern on the photoresist film, (b3) developing the exposed photoresist film to form the photoresist pattern of the grating pattern, (b4) finishing the photoresist pattern neatly by ashing the photoresist pattern by an $O_2$ asher, and (b5) forming the diffraction grating by applying etchant on the substrate on which the photoresist pattern is formed.

In addition, in the present invention, in the step (c), a mask for forming the selective area growth mask is further formed to have a width and a length larger than those of the selective area growth pattern so as to protect the selective area growth pattern. Also, after the step (e), there is further provided a step of growing an epitaxial layer on the epitaxial layers and the current blocking layers to be continuous to the epitaxial layers so as to adjust the thickness of the epitaxial layers.

BRIEF DESCRIPTION OF THE DRAWINGS

The above objective and advantages of the present invention will become more apparent by describing in detail a preferred embodiment thereof with reference to the attached drawings in which.

DESCRIPTION OF THE PREFERRED EMBODIMENT(S)

Figure 11:
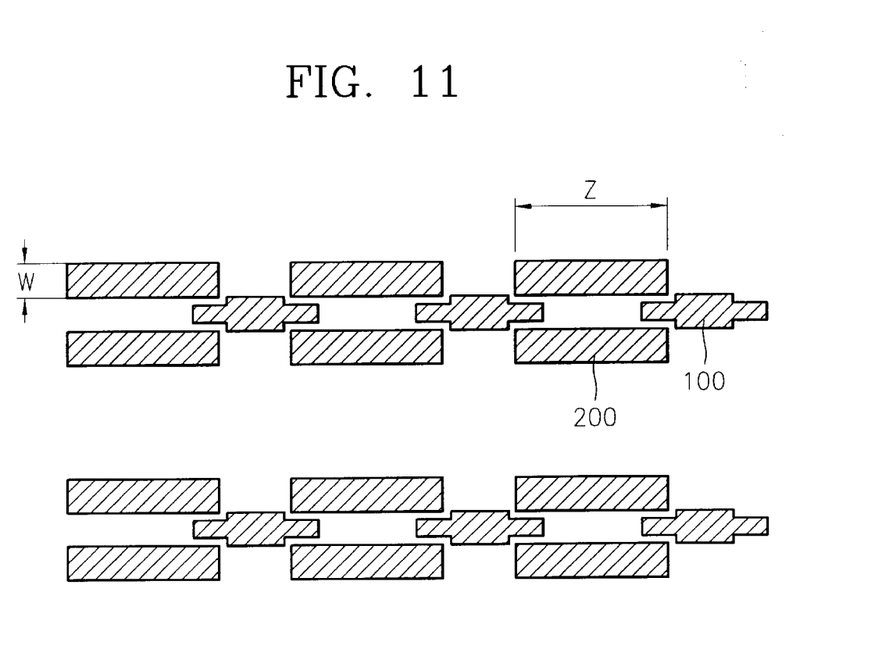
FIG. 11 is a plan view illustrating a pattern of a mask for forming a selective diffraction grating and selective area growth according to the present invention.

FIG. 11 shows a pattern of a mask for forming a selective diffraction grating and selective area growth according to the present invention. As shown in FIG. 11, a mask for forming a selective diffraction grating and selective area growth according to the present invention is composed of an island type pattern 100 for forming a selective grating, and a stripe type pattern 200 for selective area growth. Here, it is preferable that the pattern 100 for forming the selective grating is formed as an island type pattern and the pattern 200 for the selective area growth is formed as a stripe type pattern. The island type pattern 100 is formed to directly correspond to an optical modulator region for the diffraction grating not to be formed in a region in which the optical modulator is to be formed (referred to as "optical modulator region" hereinafter), and the stripe type pattern 200 is formed to correspond to a region in which the diffraction grating is to be formed and the selective area growth is to be carried out (referred to as "laser diode region" hereinafter). The island type pattern 100 is used to prevent height difference between the laser diode region and the optical modulator region from occurring during the formation of the diffraction grating, and the stripe type pattern 200 is disposed for dual purpose; one is, as a preventive measure, to prevent the diffraction grating from being formed during the formation of the diffraction grating in a region in which the selective area growth mask is to be formed, and the other is to be immediately used as the selective area growth mask after the diffraction grating is formed and the island type pattern 100 is removed.

Figure 12:
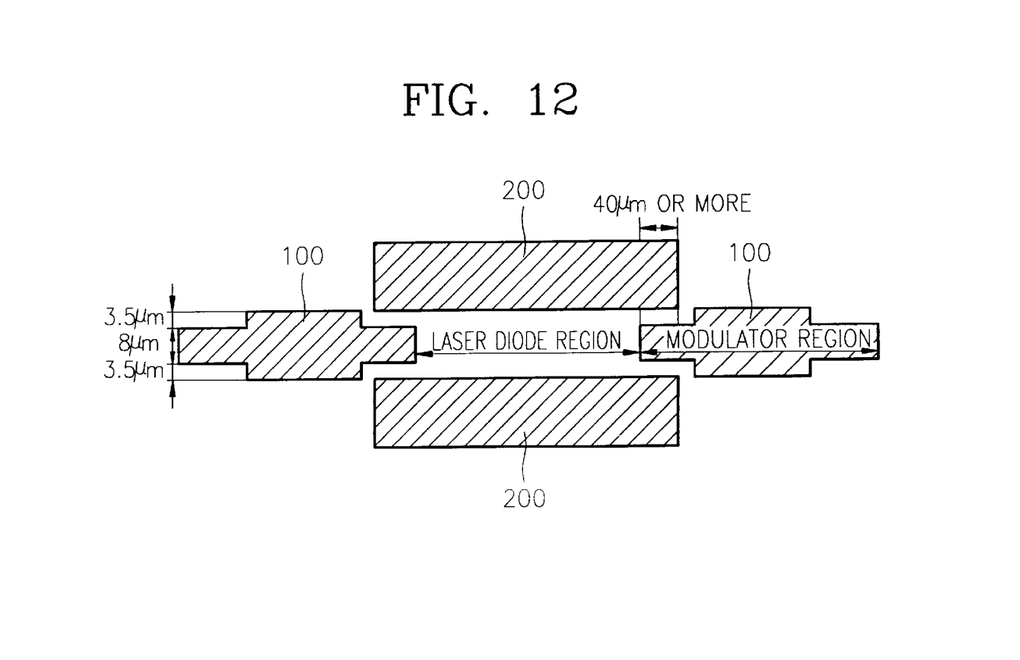
FIG. 12 is a plan view illustrating dimensions of a trench region in the mask of FIG. 11.

Here, the island type pattern 100 may have a "−" shape other than a cross shape shown in FIG. 11, and any shape is possible which has a portion which can be inserted between stripes of the stripe type pattern 200 to 40 μm extent, and the other portion which has a width enough to cover an optical modulator to be formed later. As shown in FIG. 12, the regions between the stripe type pattern 200 and the inserted portion of the island type pattern 100 are called trench regions (40×3.5 μm). The trench region has a role for preventing etchant on the island type pattern formed in the optical modulator region from diffusing toward the laser diode region. Without such trench region, the height differences occur after etching (etching after grating formation).

Figure 13:
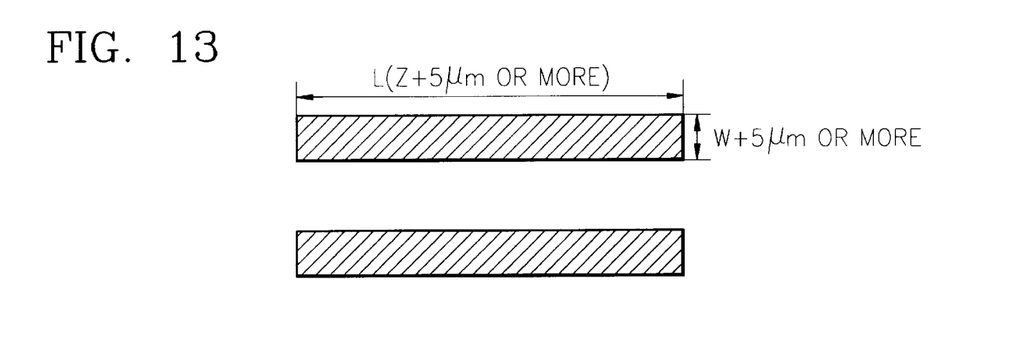
FIG. 13 is a plan view illustrating a pattern of a mask for protecting a selective area growth pattern when a pattern for forming the selective grating is removed from the mask for forming a selective diffraction grating and selective area growth.

On the other hand, in order to use the stripe type pattern 200 as a selective area growth mask, it is necessary to remove the island type pattern 100 while allowing the stripe type pattern 200 to remain. To this end, a mask for forming a selective area growth mask pattern is used, and has a stripe shape. The width and length of the mask must be larger than those of the stripe type pattern 200 by given dimensions. That is, as shown in FIG. 13, the width of the mask for forming a selective area growth mask pattern is wider than that of the selective area growth mask pattern, i.e., the region in which the stripe type pattern 200 is formed by 5 μm or more, the length is longer by 5 μm or more. This is for the purpose of allowing processing margins of a mask aligner when the island type pattern 100 is removed.

A method for fabricating an EML device by using such mask for forming the selective diffraction grating and the selective area growth.

Figure 14A:
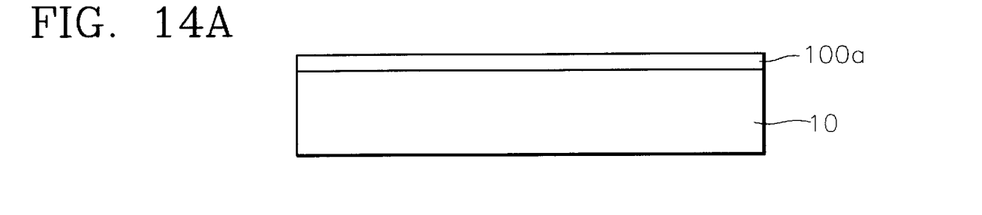
FIGS. 14A through 14F are section views illustrating, in sequence, the steps of a method for fabricating an EML device by using the mask of FIG. 11 for forming a selective diffraction grating and selective area growth.

First, as shown in FIG. 14A, a silicon dioxide film 100a is deposited on a InP substrate 10. The silicon dioxide film is formed to be used as a mask for forming the selective diffraction grating and the selective area growth.

Figure 14B:
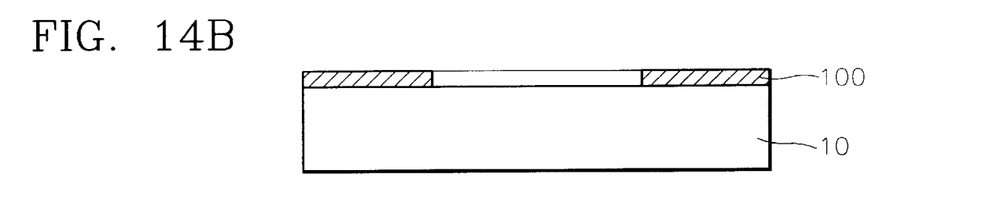

Next, the silicon dioxide film 100a is patterned and formed to be a mask (100+200) for forming the selective diffraction grating and the selective area growth, which comprises a island type pattern 100 and a stripe type pattern 200 as shown in FIG. 14B.

Figure 14C:
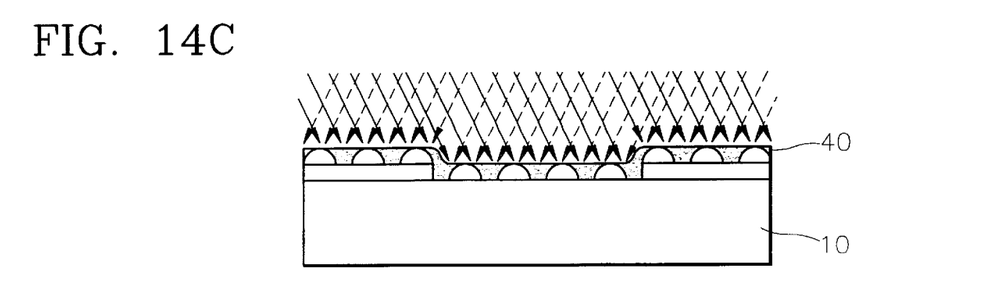

Next, as shown in FIG. 14C, photoresist is deposited on the InP substrate 10 and the photoresist film 40 is exposed to light ray of a grating pattern formed by a holographic effect to form the grating pattern.

Figure 14D:
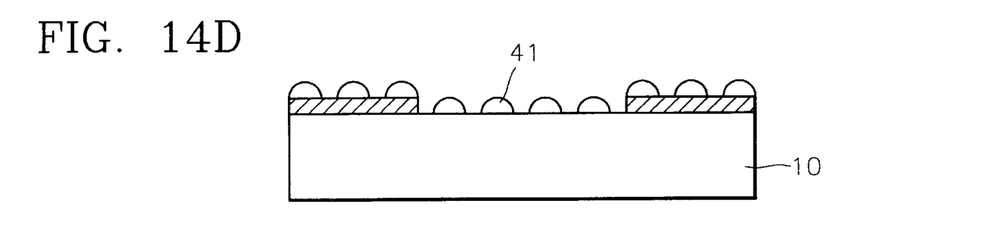

Next, the exposed photoresist film 40 is developed to form the photoresist pattern 41 of the grating pattern as shown in FIG. 14D. The photoresist pattern 41 is burned by a O₂ asher to clean the photoresist pattern 41.

Figure 14E:
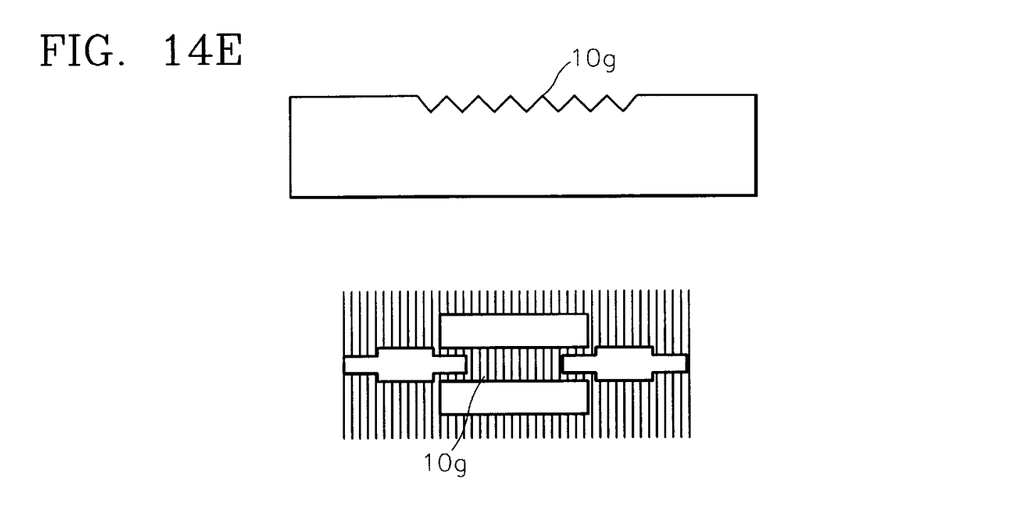

Next, etchant is deposited on the substrate to form a diffraction grating 10g as shown in FIG. 14E. In case that the diffraction grating 10g is formed by wet etching, since the silicon dioxide pattern is formed to be an island type, height differences do not occur at the boundary between the laser diode region in which the diffraction grating 10g is formed and the optical modulator region in which the diffraction grating 10g is not formed.

Next, the island type pattern 100 for forming the diffraction grating 10 is removed. By doing so, the modulator region is exposed, and in addition, the laser diode region provided with the diffraction grating is ready to carry out the selective area growth by the stripe type pattern 200. That is, the stripe type pattern 200 will serve as a selective area growth mask. At this time, the island type pattern 100 is etched and removed by using the mask for forming the selective area growth mask pattern to protect the stripe type pattern 200.

Figure 14F:
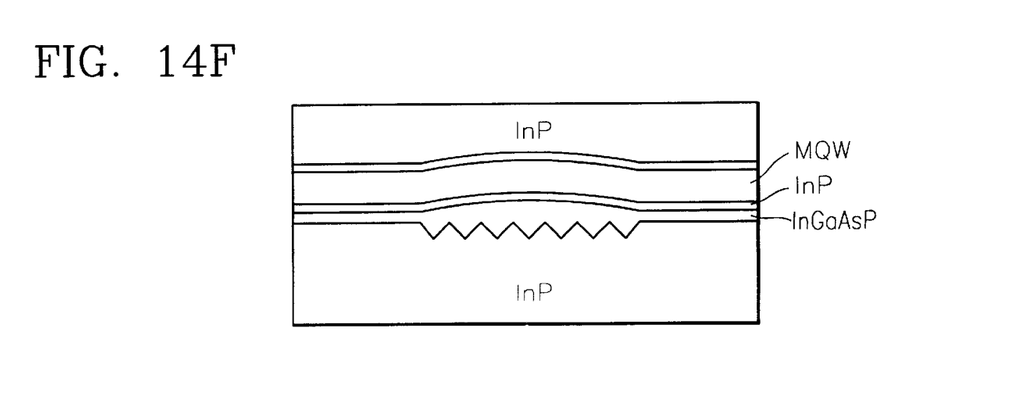

Next, as shown in FIG. 14F, epitaxial layers are grown in sequence on the laser diode region in which the diffraction grating was formed and the modulator region. At this time, the growing rate of the epitaxial layer grown on the laser diode region and in the selective area growth mask, i.e., the stripe type pattern 200 is higher than that of the epitaxial layer grown on the modulator region, and therefore the epitaxial layer for lasing grows more quickly. This is because grains moving onto the silicon dioxide film of the selective area growth mask migrate toward the laser diode region.

Next, after mesa etching to form a strong index guiding structure, the current blocking layers 12a and 12b are formed at the etched portion for current confinement.

Next, an upper clad layer 13 is regrown, and a cap lay 14 is formed on it. Here, by growing the upper clad layer 13 to an appropriate thickness, the thickness of the whole upper clad layers including the upper clad layer formed at upper portion of the basic epitaxial layers 11 formed for lasing can be adjusted, and therefore an optical guide structure appropriate to lasing and optical modulation can be obtained.

Next, isolation etching for electrically isolating the laser diode from the modulator is performed to form a trench region like a region II of FIG. 1, and the manufacturing process of the EML device is completed by respectively forming electrodes on the laser diode and the modulator.

Figure 15A:
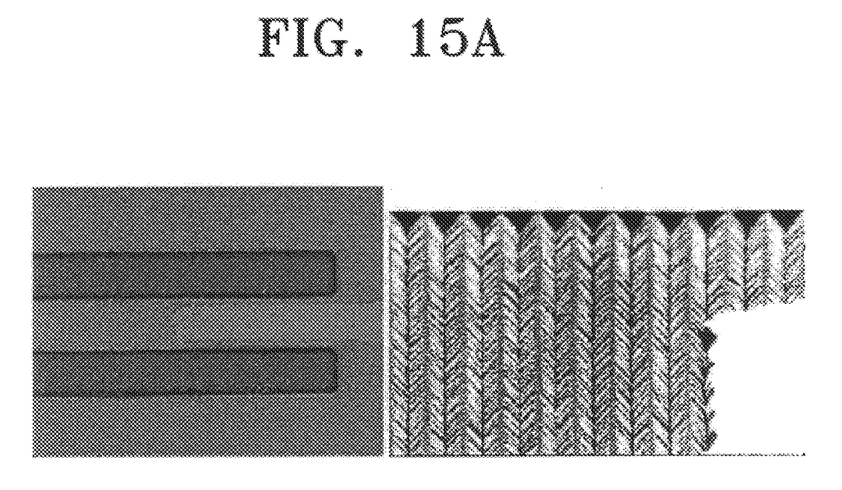
FIG. 15A shows a microphotograph and an SEM photograph illustrating a perspective view of a selective diffraction grating formed by using the mask pattern of FIG. 11.

FIG. 15A shows a SEM microphotograph of a selective diffraction grating actually formed on a sample substrate by using a mask for mask for forming a selective diffraction grating and selective area growth in the manufacturing process of the EML device. When comparing this with the SEM photograph of FIG. 10A, in the selective diffraction grating formed by using the mask for forming a selective diffraction grating and selective area growth according to the present invention, it is found that almost no height difference occur at the boundary between the laser diode and the modulator.

Figure 15B:
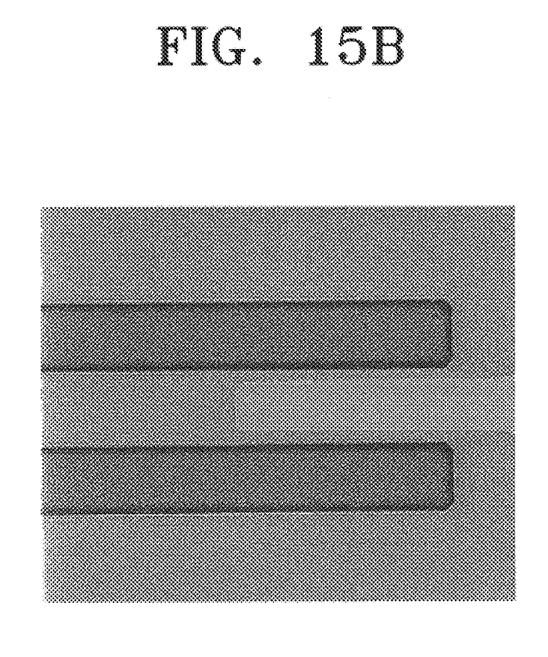
FIG. 15B is a microphotograph illustrating a section view of a selective area growth pattern formed on the sample of FIG. 15A.

Also, FIG. 15B shows an optical microscopic photograph taken after forming a selective area growth mask on the sample substrate of FIG. 15A on which the selective diffraction grating was formed. When comparing this with FIG. 8, it is found that the selective area growth pattern formed by removing the island pattern from the mask for forming a selective diffraction grating and selective area growth according to the present invention has a neat and continuous boundary between the laser diode region and the modulator region.

As described above, the mask for forming a selective diffraction grating and selective area growth according to the present invention comprises the +or − shaped island type pattern and the stripe type pattern, allows the selective grating to be formed only in the laser diode region during the formation of the selective grating, and also allow the selective area growth to be carried out only with the stripe pattern in the laser diode region after the island pattern being removed during the selective area epitaxial growth. Thus, the mask for forming a selective diffraction grating and selective area growth according to the present invention has the following advantages in manufacturing the EML device.

First, almost no height difference occur at the boundary between the region in which the selective grating is formed and the region in which the selective grating is not formed.

Second, since the selective area growth pattern is formed previously, the selective grating is not formed around the laser diode region during the formation of the selective grating. Therefore, the selective area growth pattern in itself can be used as the selective area growth mask to allow the epitaxial layer for lasing to grow neatly.

Third, since the selective area growth pattern in itself can be the selective area growth mask by removing the region (the island type pattern region) other than the selective area growth pattern region from the silicon dioxide pattern for forming the selective grating, the silicon dioxide deposition is required only once, and therefore the whole process become simpler and the total processing time is reduced.

What is claimed is:

1. A method for fabricating an electro-absorption modulated laser device in which a laser diode and an optical modulator are formed on a substrate by continuous epitaxial growth comprising:

(a) forming a mask for forming a selective diffraction grating and selective area growth, the mask comprising, on the substrate, a pattern for forming the selective diffraction grating which is formed to correspond to the modulator region and a pattern for the selective area growth which allows the selective area growth to be carried out in the laser diode region of a stripe shape wherein trench regions are formed between the stripe type pattern and the inserted portion of the island type pattern to have a predetermined depth;

(b) forming the selective diffraction grating on the substrate of the laser diode region by using the mask for forming the selective diffraction grating and the selective area growth;

(c) removing the pattern for forming the selective diffraction grating from the mask for forming the selective diffraction grating and selective area growth, and forming a mask for the selective area growth which is composed of the selective area growth pattern only;

(d) growing epitaxial layers for laser oscillation and optical modulation on the substrate of the laser diode region and the modulator region wherein the selective area growth is performed by growing the epitaxial layers on the diffraction grating in the laser diode region fast than epitaxial growth in the modulator region;

(e) etching both edge of the epitaxial layers to form a mesa structure, and forming current blocking layers on the etched portions;

(f) forming a cap layer on the mesa structure and the current blocking layers; and (g) depositing electrode metal on the epitaxial layers, and forming a trench by region by performing etching for electrically isolating the laser diode and the modulator from each other,
   wherein the patter for forming the selective diffraction grating is formed to be an island type patter in which the region other than the portion of the pattern inserted between the selective area growth pattern is larger than the modulator region and
   wherein the selective area growth pattern is formed in a stripe shape.

2. The method for fabricating an electro-absorption modulated laser device as claimed in claim 4, wherein the mask pattern is made of a silicon dioxide film.

3. The method for fabricating an electro-absorption modulated laser device as claimed in claim 1, wherein the step (b) includes the sub-steps of:
   (b1) coating photoresist on the substrate on which the mask for forming the selective diffraction grating and the selective area growth;
   (b2) exposing the photoresist film to light rays of a grating pattern by a holographic effect to form a grating pattern on the photoresist film;
   (b3) developing the exposed photoresist film to form the photoresist pattern of the grating pattern;
   (b4) finishing the photoresist pattern neatly by ashing the photoresist pattern by an $O_2$ asher; and
   (b5) forming the diffraction grating by applying etchant on the substrate on which the photoresist pattern is formed.

4. The method for fabricating an electro-absorption modulated laser device as claimed in claim 1, wherein in the step (c), a mask for forming the selective area growth mask is further formed to have a width and a length larger than those of the selective area growth pattern so as to protect the selective area growth pattern.

5. The method for fabricating an electro-absorption modulated laser device as claimed in claim 1, wherein the method further includes, after the step (e), a step of growing an epitaxial layer on the epitaxial layers and the current blocking layers to be continuous to the epitaxial layers so as to adjust the thickness of the epitaxial layers.

6. The method for fabricating an electro-absorption modulated laser device as claimed in claim 1, wherein the mask pattern is made of a silicon dioxide film.

7. The method for fabricating an electro-absorption modulated laser device as claimed in claim 1, wherein the mask pattern is made of a silicon dioxide film.

\* \* \* \* \*